(12) United States Patent
Feldotte et al.

(10) Patent No.: US 7,830,294 B2
(45) Date of Patent: Nov. 9, 2010

(54) MEASUREMENT AMPLIFICATION DEVICE AND METHOD

(75) Inventors: Heinrich Feldotte, Goettingen (DE); Alfred Klauer, Goettingen (DE)

(73) Assignee: Sartorius AG, Goettingen (DE)

( * ) Notice: Subject to any disclaimer, the term of this patent is extended or adjusted under 35 U.S.C. 154(b) by 4 days.

(21) Appl. No.: 12/430,186

(22) Filed: Apr. 27, 2009

(65) Prior Publication Data

US 2009/0207064 A1    Aug. 20, 2009

Related U.S. Application Data

(63) Continuation of application No. PCT/EP2007/009231, filed on Oct. 24, 2007.

(30) Foreign Application Priority Data

Oct. 27, 2006    (DE) .................... 10 2006 051 365

(51) Int. Cl.
*H03M 1/50* (2006.01)
(52) U.S. Cl. ............... 341/167; 341/155; 341/166; 341/168
(58) Field of Classification Search .......... 341/166–168
See application file for complete search history.

(56) References Cited

U.S. PATENT DOCUMENTS

| | | | |
|---|---|---|---|
| 3,765,012 A | | 10/1973 | Gruetzediek et al. |
| 4,031,532 A | | 6/1977 | First |
| 4,243,975 A | * | 1/1981 | Masuda et al. ............... 341/168 |
| 4,364,028 A | * | 12/1982 | Masuda et al. ............... 341/118 |
| 4,814,692 A | * | 3/1989 | Baumann .................... 324/607 |
| 4,862,382 A | | 8/1989 | Schneider et al. |
| 5,014,058 A | | 5/1991 | Horn |
| 5,117,227 A | | 5/1992 | Goeke |
| 5,128,676 A | * | 7/1992 | Ordway ....................... 341/167 |

FOREIGN PATENT DOCUMENTS

| | | |
|---|---|---|
| DE | 21 14 141 | 9/1972 |
| DE | 2164315 | 7/1973 |
| DE | 28 20 601 | 11/1979 |
| DE | 36 33 790 A1 | 4/1988 |
| DE | 37 10 904 A1 | 10/1988 |
| DE | 42 22 580 | 4/1993 |
| DE | 100 40 373 | 2/2001 |
| JP | 60 143026 A | 7/1985 |
| WO | 03 087749 A2 | 10/2003 |

* cited by examiner

*Primary Examiner*—Khai M Nguyen
(74) *Attorney, Agent, or Firm*—Sughrue Mion, PLLC

(57) ABSTRACT

Measurement amplification methods and devices for detecting the detuning of a measurement bridge (10) to which a bipolar, rectangular supply voltage ($U_s$) is supplied. The methods and devices use integrating A/D conversion and are characterized in that a reference voltage ($U_{ref}$) used for the A/D conversion undergoes polarity changes synchronized with the polarity changes of the supply voltage ($U_s$). Offset and drift are eliminated by totaling an even number of individual measurements.

13 Claims, 3 Drawing Sheets

MEASUREMENT AMPLIFICATION DEVICE AND METHOD

This is a Continuation of International Application PCT/EP2007/009231, with an international filing date of Oct. 24, 2007, which was published under PCT Article 21(2) in German, and the complete disclosure of which, including amendments, is incorporated into this application by reference.

FIELD AND BACKGROUND OF THE INVENTION

The invention relates to a measurement amplification device for detecting the detuning of a measuring bridge to which a bipolar, rectangular supply voltage is supplied.

The invention also relates to a measurement amplification method for detecting the detuning of a measuring bridge to which a bipolar, rectangular supply voltage is supplied.

Known devices have an integrating A/D converter which generates a digital output value which is representative of the bridge detuning, based on an analog bipolar detuning signal from the measuring bridge. The A/D converter comprises an integrator which integrates a measured signal that is constantly applied to said integrator during operation and a working level of a reference signal that is applied to said integrator at certain times. The A/D converter also comprises a comparator which is connected downstream of the integrator and compares an integrator output signal with a threshold value. The comparator determines each time point at which the integrator output signal crosses the threshold value. By means of a comparator output signal which is fed back to a switchable reference voltage source, the comparator controls the application, at certain times, of the working level of the reference signal. Time measuring means detect the duration of each measured interval, since it is thereby defined that throughout its duration, the working level of the reference signal is applied to the integrator as the basis of a measure for the bridge detuning.

Methods and devices of this type for digitizing detection of measured signals, in particular detuning signals of a measuring bridge, are known in the context of carrier frequency amplification and carrier frequency conversion. The term "measuring bridge" can be understood broadly and includes not only the classical Wheatstone bridge, but also "half-bridges" and other circuits fed with a supply voltage, having at least one variable resistor, the adjustment of which leads to detuning of a detuning voltage detectable from the circuit.

Before the introduction of the carrier frequency principle, a DC voltage measured signal, for example, the detuning signal of a measuring bridge was pre-amplified by means of a DC amplifier and then digitized in an integrating A/D converter.

The principle of the integrating A/D converter has long been known in many variants, for example, from DE 21 14 141, DE 28 20 601 C2 and DE 100 40 373 A1. In an integrating A/D converter, the measured signal is applied to an input of an operational amplifier configured as an integrator. For configuration as an integrator, the output of the operational amplifier is linked via a capacitor to its measured signal input. Also linked to the measured signal input of the operational amplifier is the feed line for a DC voltage reference signal. This reference signal is applied at a working level only at certain times. During the remainder of the time, it is applied at a quantitatively lower rest level or is completely disconnected from the input of the operational amplifier. During a first pulse portion of a measuring clock pulse, during which the working level of the reference signal is not applied, the capacitor is charged up by the measured signal amplified in the operational amplifier. If, after a pre-determined time period, the working level of the reference signal is switched on, the capacitor discharges during a second clock pulse portion, so that the integrator output signal declines. The time point of a zero-crossing or, more generally, a threshold-crossing by the integrator output signal is detected by means of a comparator connected downstream, which itself initiates, via control means, the disconnection of the working level of the reference signal from the integrator input, so that a new measuring clock pulse can begin with the charging of the capacitor. The duration of the second clock pulse portion, that is, the time span during which the working level of the reference signal is applied to the integrator, is measured with suitable time measuring means, for example, a clocked counter. The measured duration, referred to herein as the measured interval, represents a measure for the charging of the capacitor taking place in the first clock pulse portion, and therefore for the level of the measured signal. In the case of time measurement by means of a clocked counter, the counter value can be used directly as a digital measure for the measured signal, i.e., in particular the detuning signal of the measuring bridge.

In the past, precise pre-amplification of the DC measured signal presented difficulties due to the associated offset voltages and their drift. This was partially corrected by the introduction of the carrier frequency principle, which also brings advantages with regard to the suppression of 1/f noise. With this principle, the measuring bridge is fed with a bipolar rectangular signal. This results in an also bipolar, rectangular detuning signal of the measuring bridge. This can be pre-amplified with known AC amplifiers. The pre-amplified AC signal can then be converted by in-phase rectification and subsequent low-pass filtration into a DC measured signal. This is known from DE 2164315. The subsequent digitization of the DC measured signal can be performed as described above.

As an alternative to in-phase rectification and subsequent low-pass filtration, a system is known from WO 03/087749 A2 wherein the pre-amplified AC detuning signal is sampled directly at high frequency, wherein the difference between the mean values of the sampled values detected in respective successive half-periods of the bipolar detuning signal is used as a measure for the bridge detuning. Compared with the previously described method of in-phase rectification and subsequent low-pass filtration, this method has the advantage of digital elimination of the offset and drift from the AC pre-amplification. However, it has the disadvantage of needing a very high frequency sampler, which has a limited resolution.

A device with voltage/frequency conversion of a detuning signal of a measuring bridge is known from DE 36 33 790 A1, wherein according to the principle of alternating integration and de-integration of the detuning signal and comparison with a threshold value in a comparator, a pulse train which has a frequency that is representative of the bridge detuning is generated. In the known device, the polarity of the supply voltage of the measuring bridge is arbitrarily reversed according to an external polarity-reversal clock pulse. The detuning signal applied to the measuring bridge also changes its polarity accordingly, and this normally takes place during an integration phase, compared to the duration of which the duration of the de-integration phase is negligibly short. In order to avoid a consequently falsely displaced pulse in the pulse train, a charge balance cycle which causes a delay of the pulse to be output is set in motion, and this also initiates the next de-integration phase. This device has several disadvantages. Firstly, even the generation of a pulse train, the frequency of which must be measured for the calculation of a measured voltage value, is unfavorable, because this is technically complex and long-winded, since for exact measurement of a frequency, many pulses, that is, many integration and de-integration phases must be taken into consideration. Secondly, the principle is based on neglecting offset voltages, capacitor residual voltages and the time needed for the de-integration. In many cases, these may be realistic assumptions. But where very rapid and/or accurate measurement is required, such factors can no longer be ignored, so that the known measuring method and the corresponding device cannot be used. Thirdly, the charge balance cycle requires a large number of additional components, which implies a correspondingly greater technical effort and energy consumption.

From DE 42 22 580 A1, a conventional A/D converter circuit with an integrator is known, to which, apart from the measured signal, different levels of a reference signal are alternately applied.

U.S. Pat. No. 4,031,532 discloses an A/D converter circuit for conversion of a detuning voltage of a measuring bridge. The circuit has an integrator to which, apart from the detuning signal, a reference signal derived from the bridge supply voltage is applied, the polarity of said reference signal being switched over for integration and de-integration. The polarity of the supply voltage, however, remains constant.

OBJECT OF THE INVENTION

It is an object of the present invention further to develop measurement amplification devices and methods to enable good offset and drift reduction in pre-amplifiers without introducing additional high-frequency, but resolution-limited elements.

SUMMARY OF THE INVENTION

According to one formulation of the invention, a measurement amplification device is proposed for detecting the detuning of a measuring bridge to which a bipolar, rectangular supply voltage is supplied, said device having an integrating A/D converter which generates a digital output value which represents the bridge detuning, based on an analog, bipolar detuning signal of the measuring bridge, wherein the A/D converter comprises:
  an integrator which integrates: (a) the detuning signal, or a bipolar signal derived therefrom, as a measured signal which is continuously applied to said integrator during operation and (b) a working level of a reference signal which is applied to said integrator intermittently,
  a comparator connected downstream of the integrator, said comparator comparing an integrator output signal with a threshold value,
  a time measurer determining a duration of each measured interval during which the working level of the reference signal in addition to the measured signal is applied to the integrator, as the basis of a measure for the bridge detuning, wherein the comparator determines each time point at which the integrator output signal crosses the threshold value and, in accordance with the crossing time points detected, a controller controls:
  a switchable supply voltage source to undertake a polarity change of the supply voltage, and
  a switchable reference voltage source to disconnect the working level of the reference signal from the integrator, so that the reference signal and the supply voltage are mutually synchronized in bipolar manner.

Also proposed, according to another formulation of the invention, is a measurement amplification method for detecting the detuning of a measuring bridge to which a bipolar, rectangular supply voltage is supplied, wherein a digital output value which represents the bridge detuning is generated by an integrating A/D converter, based on an analog, bipolar detuning signal of the measuring bridge, wherein:
  an integrator of the A/D converter integrates: (a) the detuning signal, or a bipolar signal derived therefrom, as a measured signal which is continuously applied to said integrator during operation, and (b) a working level of a reference signal which is applied to said integrator intermittently,
  an integrator output signal is compared with a threshold value, and
  the duration of each measured interval during which the working level of the reference signal in addition to the measured signal is applied to the integrator is detected and used as the basis for determining a measure for the bridge detuning, wherein each time point at which the integrator output signal crosses the threshold value is determined and, in accordance with the crossing time points detected:
  a switchable supply voltage source is caused to undertake a polarity change of the supply voltage, and
  a switchable reference voltage source is caused to disconnect the working level of the reference signal from the integrator, so that the polarities of the reference signal and the supply voltage are synchronized.

It is provided according to the invention that the supply voltage source does not function as the underlying clock pulse generator, but that it is dependent on the comparator output signal. This means that each polarity reversal of the supply voltage rectangular signal takes place depending on the threshold value-crossing of the integrator output signal, in particular its zero-crossing. It is also provided according to the invention that it is not a rectified signal that is used as the measured signal for the A/D converter, but the bipolar detuning signal itself or a bipolar signal that is derived, in particular through AC pre-amplification. Finally, it is provided according to the invention that a bipolar signal is used also as the reference signal, which is synchronized, with respect to its polarity, with the supply voltage. This means, in other words, that the polarity reversal of the supply voltage and the reference signal take place in a well defined manner relative to one another.

The underlying concept of the present invention is direct digitization of the possibly pre-amplified detuning signal by respective adjustment of the reference signal to the polarity of the measured signal, which is determined by the polarity of the supply voltage. Over two successive integration phases, the capacitor of the integrator is charged in the reverse direction and then discharged again. As known from the prior art, the discharging time, that is, the period for which the working level of the reference signal is applied, is taken as a measure of the level of the measured signal and therefore of the bridge detuning.

An advantage of the present invention is the resulting lack of any need for rectification and low-pass filtration of the analog measured signal, which is required in the prior art. This saves components and does away with the associated sources of error. At the same time, "rectification" in the digital domain, that is, averaging and difference formation in the oversampled, bipolar digitized measured signal, which results in the above-described disadvantages, is also unnecessary. Rather, rectification occurs as a "natural" result of digitization with a bipolar reference signal.

Particularly preferred embodiments of the present invention are defined in the dependent claims.

It is therefore advantageous if the switchable supply voltage source serves together with an additional reference signal switch as a switchable reference voltage source. This avoids the necessity of two voltage sources which must be matched to one another with additional synchronization means. Rather, the switchable supply voltage source can be a bipolar source, the positive and negative connections of which can be connected to the measuring bridge alternately by means of a switch, the control of which depends on the comparator output signal. The resulting bipolar rectangular signal can be fed, via a switch also controlled depending on the comparator output signal, to the integrator as a reference signal.

Advantageously, the dependence of the supply voltage and the reference signal on the comparator output signal is realized such that the comparator is configured to determine the time point of each crossing of the threshold value by the integrator output signal, in particular the zero-crossing, and a controller is provided for feedback of the comparator output signal, the controller controlling the switchable supply voltage source, depending on the determined crossing time point, to cause a polarity reversal in the supply voltage, and the switchable reference voltage source to disconnect the working level of the reference signal from the integrator. In other words, it is preferably provided that, when the integrator output signal is compared with a threshold value, in particular the zero value, the time point at which the integrator output signal crosses the threshold value is detected and the polarity reversal of the supply voltage and the disconnection of the working level of the reference signal from the integrator are carried out depending on the detected time point. Typically, the control is configured so that threshold-crossing or zero-crossing of the integrator output signal, polarity reversal of the supply voltage and disconnection of the working level of the reference signal from the integrator input take place essentially simultaneously or synchronously with the clock pulse of a clocked counter used for time measurement. However, targeted deviations from the synchronous simultaneity can be set. Comparable deviations to improve the convergence behavior of a measurement amplification device are known from the above-cited DE 100 40 373 A1. The principles disclosed in that publication can easily be applied to the present invention.

In a particularly advantageous development of this embodiment of the invention, it is provided that the controller is also configured to control the switchable reference voltage source following a pre-determined time interval after each disconnection of the working level of the reference signal from the integrator, for renewed application of the working level of the reference signal to the integrator. With regard to the inventive method, this means that the working level of the reference signal is applied to the integrator, in each case, after a pre-determined time interval following disconnection of the working level of the reference signal from the integrator. In other words, this means that the time during which the reference signal is not applied again or the rest level of the reference signal is applied to the integrator, and thus the time during which the capacitor of the integrator is charged, is essentially fixed. The integrator is therefore given a pre-determined charging time. By contrast, the discharging time of the capacitor, that is, the time during which the working level of the reference signal is applied, is variable and dependent on the quantity of integrated charge. This period, the measured interval, is ended by the comparator output signal and its duration is determined as a measure for the level of the measured signal level. It should be noted that in this embodiment of the invention, in order to determine the measured interval, in practice the duration of the whole measuring clock pulse, that is, the duration of an integration phase and a de-integration phase which, in a preferred embodiment of the invention is equal to the duration between two polarity changes in the supply voltage, can be used as a measure for the bridge detuning, since only one constant time interval, specifically the duration of the charging phase of the capacitor, is added to the variable clock pulse portion, that is, the measured interval or the discharging phase of the capacitor.

Alternatively to the previously outlined variant with a variable measuring clock pulse, in another favorable embodiment of the invention, the measuring clock pulse can be kept constant. For this purpose, it is provided that the controller is also configured to control the switchable reference voltage source after a fixed time interval following, in each case, a preceding application of the working level of the reference signal to the integrator, for renewed application of the working level of the reference signal to the integrator. With regard to the inventive method, this means that the working level of the reference signal is applied anew to the integrator, in each case, after a fixed time interval following a preceding application of the reference signal to the integrator. In other words, the time period between two successive switching procedures for applying the working level of the reference signal to the integrator remains constant. However, the time period during which the working level of the reference signal remains applied to the integrator or the time during which the reference signal is not applied, or the rest level of the reference signal is applied, to the integrator is variable. The proportions of the charging and discharging phases within a fixed measuring clock pulse are therefore variable. It should be noted that, due to the simple dependency of the durations of the discharging phase and the charging phase on one another, in practice each of these phases is measured to determine the measured interval and can serve as the basis for a measure of the bridge detuning.

As mentioned above, when an AC pre-amplifier is used, offset and drift present a serious problem for the accuracy of the measurement of the bridge detuning. The offset has the effect that during two successive measuring clock pulses with different polarity of the supply voltage, different measured signal levels are applied to the integrator. Drift has the effect that an offset of this type cannot be eliminated by a single adjustment, since it changes over time, for example, due to temperature or moisture. However, this change occurs very slowly compared to the duration of the measuring clock pulses. To eliminate the time-variable offset, therefore, in a preferred development of the invention, adding means are provided for totaling an even number of measured interval durations, and output means are provided for outputting an output value based on the totaled value as a measure for the bridge detuning. With regard to the inventive method, this means that an even number of successive measured interval durations are totaled and, based on the totaled value, a measure for the bridge detuning is output. In this way, the respective offset is entirely eliminated.

At the same time, the totaling of the measured interval durations improves the resolution of the overall measurement. An independent measurement of an interval duration by means of a clocked counter is laden with an error of one clock pulse. It is therefore immediately clear that a continuous measurement which comprises an (even) number of interval durations and is also laden with an error of only one counter pulse, has a smaller relative error, that is, a better resolution. The resolution improvement also arises in the present case if an (even) number of sequential, separately measured interval durations are totaled. The reason for this lies therein that, due to the synchronous control of the reference signal, the durations of the capacitor charging intervals are not independent of the durations of the measured intervals between which they are embedded, that is, the rules of the error propagation theorem are not applicable. The resolution-improving effect of totaling an even number of measured interval durations therefore arises in each of the variants described above.

It is preferably provided that the adding means are configured to base a current determination of the totaled value on the sequence of measured interval durations on which a preceding determination was based, without a pre-determined number of durations of the oldest measured intervals and additionally with the same number of durations of the newest measured intervals that were not taken into account in the preceding determination. With regard to the inventive method, this means that a current determination of the totaled value is based on the sequence of measured interval durations on which a preceding determination was based, without a pre-determined number of durations of the oldest measured intervals and additionally with the same number of durations of the newest measured intervals that were not taken into account in the preceding determination. In other words the sequence of measured intervals, the durations of which are each totaled to determine an offset-free measure of the detuning voltage, is determined in the manner of a "moving window." If, for example, the measured interval durations measured at time points t1, t2, t3 and t4 (where t1<t2<t3<t4) are added to determine the totaled measured interval duration, on a subsequent determination, the durations measured at time points t2, t3, t4 and t5 (where t2<t3<t4<t5) can be added. This means that, following each determination of a measured interval duration, an updated measure of the detuning of the measuring bridge can be output, wherein each current output value gains from the offset-freedom and the high resolution resulting from the addition. In this example, the "moving window" is displaced by one measured interval each time. Naturally, other step sizes can also be used for the displacement.

It should also be noted that there is a danger that, due to the inventive polarity reversal of the supply and reference signals, an additional error source can arise. The error thereby introduced grows with the frequency of the polarity reversal. In one variant of the invention, it can therefore be provided that the reversal of polarity in the supply voltage and thus also in the reference voltage is not activated with every clock pulse, but only on every $n^{th}$ measuring clock pulse, that is, after every $n^{th}$ measured interval, where n preferably lies between 2 and 100, in particular between 2 and 10. The actual choice of n is made by considering the error incurred by the switching frequency and the increased reaction inertia when n is made larger. For the elimination of the offset by addition, in this variant, it is necessary to total an even multiple of n measured interval durations. In this variant, however, the choice of step size is not limited when a moving window is used.

BRIEF DESCRIPTION OF THE DRAWINGS

Further features and advantages will now be described by reference to exemplary embodiments and the drawings, in which.

DETAILED DESCRIPTION OF PREFERRED EMBODIMENTS

Figure 1:
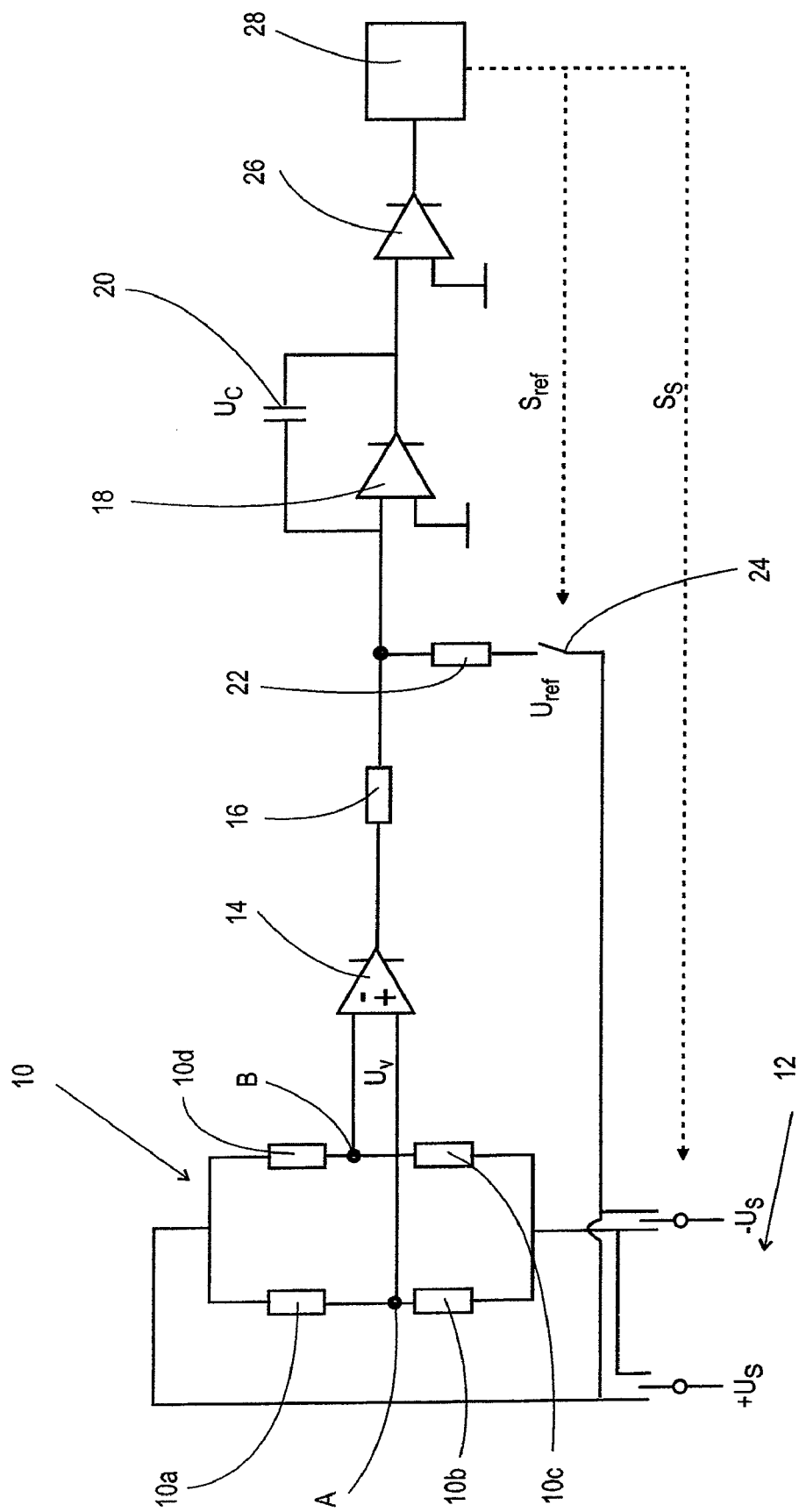
FIG. 1 is a schematic equivalent circuit diagram of an embodiment of the present invention.

FIG. 1 shows, in schematic form, an equivalent circuit diagram of a device according to the present invention. Shown on the left side of FIG. 1 is a measuring bridge 10 comprising four resistors 10a, 10b, 10c, 10d. Measuring bridges of this type, wherein at least one of the resistors 10a-d is variable, are often used in measuring technology. In particular one or more of the resistors 10a-d can be configured, for example, as strain gauges, as is often the case, for example, in precision force gauges. The measuring bridge 10 is supplied with a supply voltage $U_S$ from a supply voltage source 12. In the case of a fully balanced measuring bridge 10, the detuning voltage $U_V$, which can be tapped off between points A and B, is equal to zero. A change in the resistance value of at least one of the resistors 10a-d results in a detuning voltage $U_V$ which differs from zero and which is a measure for the variable to be determined, for example, the bending of a force gauge element. The supply voltage source 12 is configured as a switchable supply voltage source which can supply a bipolar supply voltage. In the embodiment shown in FIG. 1, this is achieved by synchronous switching of the outputs with equal-valued voltages of reverse polarity. It should be noted that the representation in FIG. 1 is purely schematic and is intended only to represent the functioning of a bipolar switchable supply voltage source. Reversing of the polarity takes place, in each case, depending on a control signal $S_S$ applied to a control input of the supply voltage source 12.

According to the bipolar supply to the measuring bridge 10, a correspondingly bipolar detuning voltage $U_V$ results. In the embodiment according to FIG. 1, this is suitably pre-amplified by an AC pre-amplifier 14. The pre-amplifier 14 is typically subject to offset and drift, so that errors needing to be corrected enter the measurement at this point.

The output voltage of the pre-amplifier 14 is converted via a resistor 16 into a corresponding current, which is applied to a first input of an operational amplifier 18 which is configured as an integrator. The second input of the operational amplifier 18 is connected to earth in the present example, although any other constant potential could, in principle, be applied. The configuration of the operational amplifier 18 as an integrator is realized with the feedback of its output signal to its first input via the integration capacitor 20, across which the capacitor voltage $U_C$ exists.

Also applied to the first input of the operational amplifier 18 is a reference voltage $U_{ref}$ which is converted, via the resistor 22, into a current. The reference voltage $U_{ref}$ is supplied by a switchable reference voltage source, which is synchronized by suitable means with the supply voltage source 12. In the embodiment shown in FIG. 1, this is particularly advantageously achieved in that the supply voltage source 12 together with an additional switch 24 is used as the reference voltage source. By this means, it is ensured that the reference voltage $U_{ref}$ always undergoes a polarity reversal simultaneously with the supply voltage $U_S$, wherein however, due to the additional switch 24, an additional clock rate can be imposed. The switch 24 is controlled by its own control signal $S_{ref}$. It should be noted that in the embodiment shown, the reference voltage $U_{ref}$ is either applied to the input of the operational amplifier or is disconnected therefrom. In other conceivable embodiments, in place of the disconnection, application of a quantitatively lower rest level can be provided.

Connected downstream of the integrator consisting of the operational amplifier 18 and the capacitor 20 is a comparator 26, which in the embodiment shown is configured as a difference amplifier connected to earth. In other embodiments, the comparator can also be connected to a potential different from earth. The time points of zero-crossing by the integrator output voltage can be determined by the comparator. A controller 28 connected downstream of the comparator 26 processes the comparator output signal to generate the control signals $S_S$ and $S_{ref}$ for controlling the supply voltage source 12 or the reference voltage source, that is, essentially the switch 24 in the embodiment of FIG. 1. The controller 28 is merely shown as a function block in FIG. 1 and can be realized in different ways, purely as hardware or as a combination of hardware and software. Their mode of operation will now be described for two particularly preferred embodiments of the invention, by reference to the timing diagrams in FIGS. 2 and 3.

Figure 2:
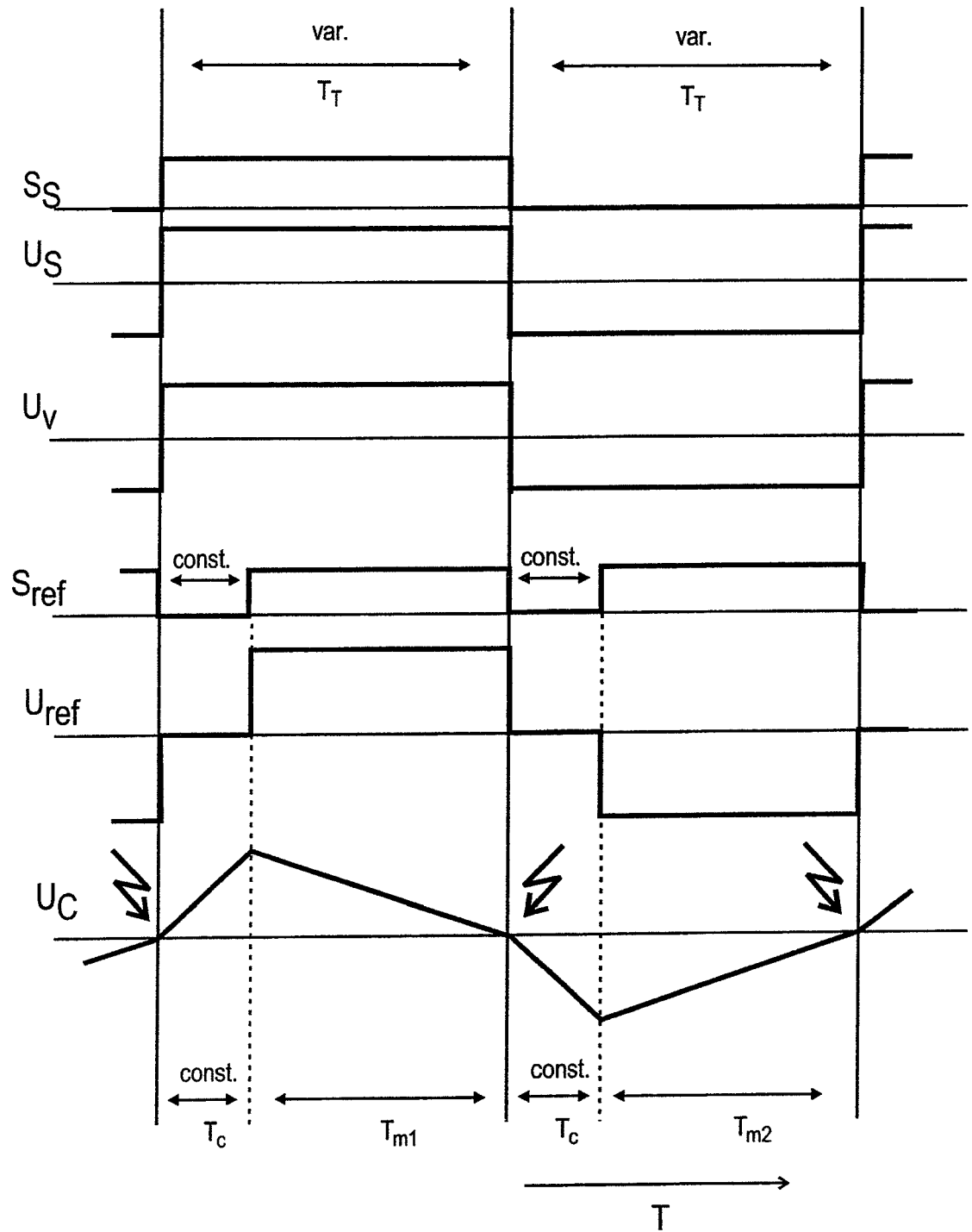
FIG. 2 is a schematic timing diagram of a first embodiment of the present invention.

FIG. 2 shows a timing diagram according to a first embodiment of the present invention. The diagram is intended merely to illustrate the relative, temporal relationships between the individual signals, wherein the representation involves arbitrary units. As stated above, the bipolar supply voltage $U_S$ follows the control signal $S_S$ which, in the embodiment illustrated, is a monopolar signal, but naturally could also be configured, for example, bipolar and/or as a pulsed signal. Of essential importance is that the polarity reversals in the supply voltage $U_S$ take place according to the control signal $S_S$. With a detuned measuring bridge 10, this results in a detuning voltage $U_V$ at the output of the measuring bridge 10 which, with regard to its polarity reversals, is synchronized with the supply voltage. In order to simplify the representation, the output signal of the inverting pre-amplifier 14, which can possibly show an offset which changes over time relative to the detuning voltage $U_V$, is not shown in FIG. 2. It should be noted that the inverting nature of the pre-amplifier 14 is not relevant to the invention, but is dependent on the direction of the detuning that is to be expected. Of importance is only that the pre-amplified detuning signal has a different polarity from the reference signal.

As previously stated, the reference voltage $U_{ref}$ undergoes essentially the same polarity changes as the supply voltage $U_S$. Added to this are the clock pulses from the control signal $S_{ref}$. In the embodiment according to FIG. 2, the reference voltage $U_{ref}$ is disconnected from the input of the integrator 18, 20 at the beginning of each measuring clock pulse. During this time, only the measured signal, that is, the inverting pre-amplified detuning voltage $U_V$, is applied to the input of the operational amplifier 18. During this first clock pulse portion $T_C$ of the measuring clock pulse $T_T$, the capacitor charges up, which leads to a (quantitative) rise in the capacitor voltage $U_C$. After the pre-determined period $T_C$, which in the embodiment of FIG. 2 is constant, the reference voltage $U_{ref}$ is additionally applied to the input of the integrator 18, 20 by switching over the switch 24 depending on the control signal $S_{ref}$. Due to its polarity, which is reversed relative to the measured signal, during the subsequent clock pulse portion $T_m$, the capacitor 20 discharges and does so until the capacitor voltage $U_C$ undergoes a zero-crossing, which is registered by the comparator 26. These time points are indicated with lightning arrows in FIG. 2. The time point of the zero-crossing is translated by the controller 28 into a synchronous change in the control signals $S_S$ and $S_{ref}$ so that the polarity of the supply voltage $U_S$ and the reference voltage $U_{ref}$ changes and the reference voltage $U_{ref}$ is also disconnected from the input of the integrator 18, 20. The subsequent measuring clock pulse takes place in the same manner as described above, but with reversed polarities.

The level of the detuning voltage $U_V$ is represented by the time interval that is necessary in order to discharge the capacitor 20 after a constant charging time $T_C$, that is, until zero-crossing by $U_C$. This duration is the measured interval $T_m$. Since, as mentioned, the charging time $T_C$ is constant, both the duration of the measured interval $T_m$ and the duration of the overall measuring clock pulse $T_T=T_C+T_m$ can be determined as a measure for the level of the detuning voltage $U_V$. Detection of the duration of $T_m$ or $T_T=T_C+T_m$ is preferably carried out by means of a high-frequency counter which starts preferably at the start of $T_C$ or $T_m$, preferably dependent on $S_{ref}$ and/or $S_S$. Detection of the different interval durations can be performed with a single counter.

As mentioned, an offset can be introduced into the measured signal by the pre-amplifier 14. This would mean that the intervals of different polarity would supply different levels of the detuning voltage $U_V$. This would have the consequence that two successive measuring clock pulses of different polarity would have different durations, wherein the duration of one measuring clock pulse would be too long by the same amount as the duration of the other measuring clock pulse would be too short. Through addition of two or, more generally, an even numbered plurality of measured interval durations or measuring clock pulse durations, this error can therefore be corrected. It should be noted that this correction is independent of any drift of the offset over time, provided the drift is slow compared with the totaled overall duration. Due to the constancy of the charging-up period $T_C$, both successive measuring intervals $T_{m1}$ and $T_{m2}$ and the durations of two successive complete measuring clock pulses $(T_C+T_{m1})+(T_C+T_{m2})$ can be used. As a result, as mentioned before, the resolution of the digitization can be improved. Rapid updating of the output measure for the detuning of the measuring bridge can be achieved by selecting the measured interval durations to be totaled as per the "moving window" method explained above.

Figure 3:
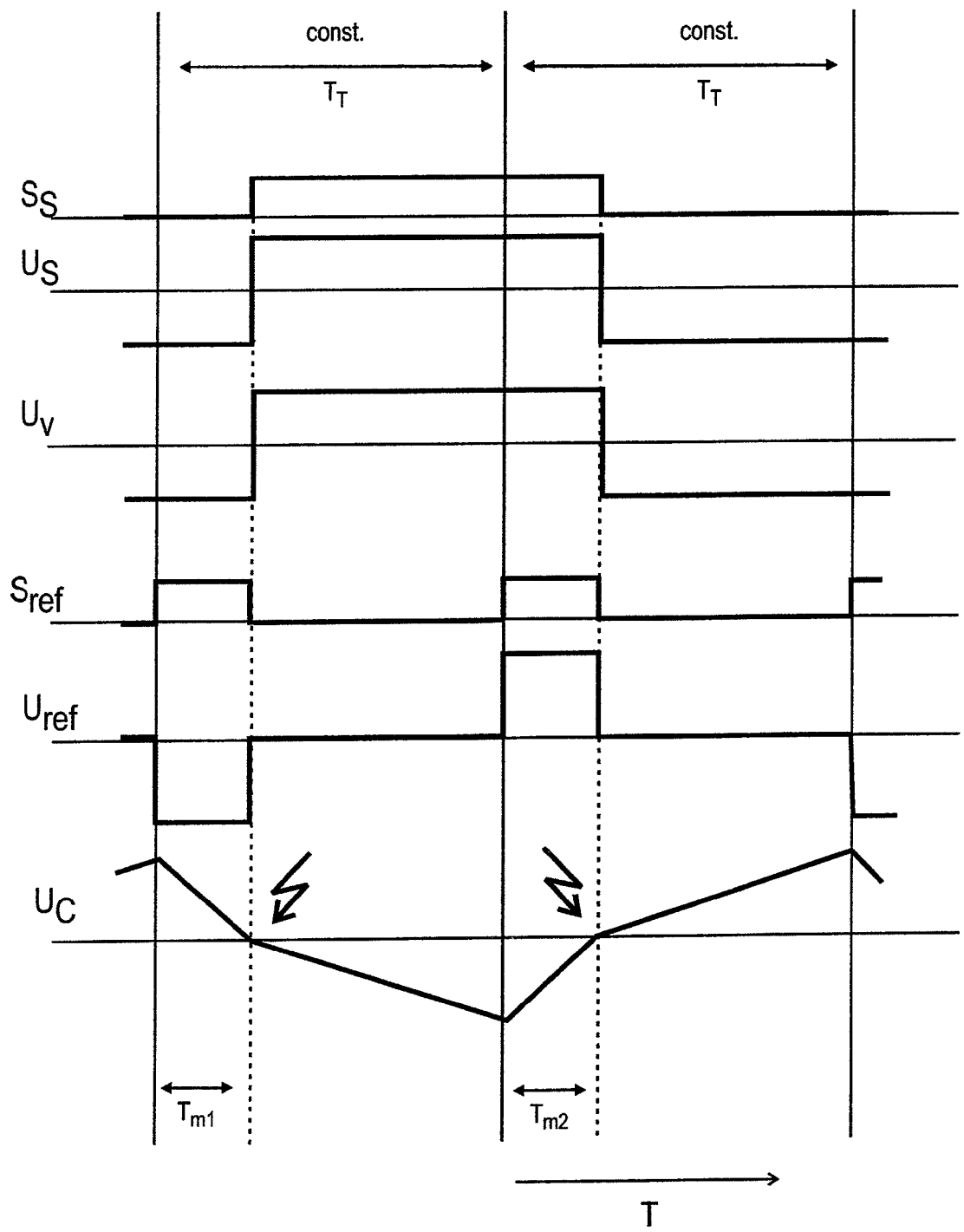
FIG. 3 is a schematic timing diagram of a second embodiment of the present invention.

FIG. 3 shows a schematic timing diagram of a second embodiment of the present invention for which the statement made above regarding FIG. 2 also applies. As distinct from the embodiment according to FIG. 2, the overall duration of each measuring clock pulse $T_T$ is constant in FIG. 3. Only the relative proportions of the charging phase and the actual measured interval $T_m$, that is, again, the time that is needed to discharge the charged-up capacitor by additional application of the reference voltage $U_{ref}$, are available.

The timing diagram of FIG. 3 is otherwise to be interpreted as described for FIG. 2. It should be noted that the different gradients of the individual sections of the $U_C$ graph are a result of the relative levels of the (possibly pre-amplified) detuning voltage $U_V$ and the reference voltage $U_{ref}$.

The embodiments shown in the drawings and explained in the detailed description are of course only intended as illustrative examples of the present invention. In light of the disclosure herein, a broad spectrum of possible variations is open to a person skilled in the art. In particular, slight deviations can be made from the strict synchronization of the individual switchable signals, for example, in order to achieve rapid convergence of the digitized signal in the event of severe level variations in the detuning voltage $U_V$. The applicant seeks to cover all such changes and modifications as fall within the spirit and scope of the invention, as defined by the appended claims, and equivalents thereof.

What is claimed is:

1. A measurement amplification device for detecting the detuning of a measuring bridge to which a bipolar, rectangular supply voltage ($U_S$) is supplied, comprising:
   an integrating A/D converter which generates a digital output value representing the bridge detuning, based on an analog, bipolar detuning signal ($U_V$) of the measuring bridge, wherein the A/D converter comprises:
   an integrator which integrates (a) either the detuning signal ($U_V$) or a bipolar signal derived from the detuning signal, as a measured signal which is continuously applied to said integrator during operation, and (b) a working level of a reference signal ($U_{ref}$) which is applied to said integrator intermittently,
   a comparator connected downstream of the integrator, said comparator comparing an integrator output signal with a threshold value,
   a time measurer determining a duration of each measured interval ($T_m$) during which the working level of the reference signal ($U_{ref}$) in addition to the measured signal is applied to the integrator, as a basis of a measure for the bridge detuning,
wherein the comparator determines each time point at which the integrator output signal crosses the threshold value and, in accordance with the crossing time points detected, a controller controls:
   a switchable supply voltage source to undertake a polarity change of the supply voltage ($U_S$), and
   a switchable reference voltage source to disconnect the working level of the reference signal ($U_{ref}$) from the integrator,
so that the reference signal and the supply voltage are mutually synchronized in bipolar manner.

2. The device as claimed in claim 1, wherein the switchable supply voltage source, together with an additional reference signal switch, serves as the switchable reference voltage source.

3. The device as claimed in claim 1, wherein the controller also controls the switchable reference voltage source, following a pre-determined time interval ($T_C$), after each disconnection of the working level of the reference signal ($U_{ref}$) from the integrator, for renewed application of the working level of the reference signal ($U_{ref}$) to the integrator.

4. The device as claimed in claim 3, wherein the overall duration between two successive polarity changes in the supply voltage ($U_S$) is used as the basis of the measure for the bridge detuning.

5. The device as claimed in claim 1, wherein the controller also controls the switchable reference voltage source after a fixed time interval ($T_T$) following a respective preceding application of the working level of the reference signal ($U_{ref}$) to the integrator, for renewed application of the working level of the reference signal ($U_{ref}$) to the integrator.

6. The device as claimed in claim 1, further comprising: an adder totaling an even number of measured interval durations, and an output outputting an output value based on the totaled value as the measure for the bridge detuning.

7. The device as claimed in claim 6, wherein the adder bases a current determination of the totaled value on the sequence of measured interval durations on which a preceding determination was based, without a pre-determined number of durations of oldest measured intervals and additionally with the same number of durations of newest measured intervals that were not taken into account in the preceding determination.

8. A measurement amplification method for detecting the detuning of a measuring bridge to which a bipolar, rectangular supply voltage ($U_S$) is supplied, comprising:
   generating a digital output value which represents the bridge detuning by an integrating A/D converter, based on an analog, bipolar detuning signal ($U_V$) of the measuring bridge, wherein:
   an integrator of the A/D converter integrates (a) either the detuning signal ($U_V$) or a bipolar signal derived from the detuning signal, as a measured signal, which is continuously applied to said integrator, and (b) a working level of a reference signal ($U_{ref}$) which is applied to said integrator intermittently,
   an integrator output signal is compared with a threshold value, and
   the duration of each measured interval ($T_m$) during which the working level of the reference signal ($U_{ref}$) in addition to the measured signal is applied to the integrator is detected and used as the basis for determining a measure for the bridge detuning,
wherein each time point at which the integrator output signal crosses the threshold value is determined and, in accordance with the crossing time points detected:
   a switchable supply voltage source is caused to undertake a polarity change of the supply voltage ($U_S$), and
   a switchable reference voltage source is caused to disconnect the working level of the reference signal ($U_{ref}$) from the integrator,
so that the polarities of the supply voltage ($U_S$) and the reference signal ($U_{ref}$) are synchronized.

9. The method as claimed in claim 8, wherein, following each disconnection of the working level of the reference signal ($U_{ref}$) from the integrator, the working level of the reference signal ($U_{ref}$) is applied again to the integrator after a pre-determined time interval ($T_C$).

10. The method as claimed in claim 9, wherein the overall duration ($T_T$) between two successive polarity changes in the supply voltage ($U_S$) is used as the basis of the measure for the bridge detuning.

11. The method as claimed in claim 8, wherein, after a fixed time interval ($T_T$), following a respective preceding application of the working level of the reference signal ($U_{ref}$) to the integrator, the working level of the reference signal ($U_{ref}$) is applied again to the integrator.

12. The method as claimed in claim 8, wherein an even number of successive measured interval durations are totaled and the measure for the bridge detuning is output based on the totaled value.

13. The method as claimed in claim 12, wherein a current determination of the totaled value is based on the sequence of measured interval durations on which a preceding determination was based, without a pre-determined number of durations of oldest measured intervals and additionally with the same number of durations of newest measured intervals that were not taken into account in the preceding determination.

* * * * *